United States Patent
Baca et al.

(10) Patent No.: US 8,182,282 B2
(45) Date of Patent: May 22, 2012

(54) LEVER BYPASS PLUG-IN METER SOCKET FOR ELECTRIC WATT-HOUR METERS

(75) Inventors: Roberto Baca, El Paso, TX (US); Gustavo Cortes Rico, Duluth, GA (US); Brian J. Rusch, Suwanee, GA (US); Fan Zhang, Suwanee, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 184 days.

(21) Appl. No.: 12/839,835

(22) Filed: Jul. 20, 2010

(65) Prior Publication Data
US 2011/0021067 A1    Jan. 27, 2011

Related U.S. Application Data

(60) Provisional application No. 61/227,903, filed on Jul. 23, 2009.

(51) Int. Cl.
*H01R 33/945* (2006.01)
(52) U.S. Cl. .................. 439/517; 361/662; 439/858
(58) Field of Classification Search .................. 439/517, 439/146, 167, 858; 361/662
See application file for complete search history.

(56) References Cited

U.S. PATENT DOCUMENTS

| | | | |
|---|---|---|---|
| 3,290,460 A * | 12/1966 | Christensen et al. ...... 200/51.11 |
| 3,714,615 A | 1/1973 | Coley |
| 4,059,334 A * | 11/1977 | Bailey .......................... 439/592 |
| 4,388,670 A * | 6/1983 | Billhartz ....................... 361/662 |
| 4,525,023 A * | 6/1985 | Lawson ........................ 439/845 |
| 4,778,961 A * | 10/1988 | M'Sadoques et al. ...... 200/17 R |
| 5,762,522 A * | 6/1998 | Robinson et al. ............ 439/517 |
| 5,775,942 A | 7/1998 | Jeffcoat |
| 5,997,347 A * | 12/1999 | Robinson et al. ............ 439/517 |
| 6,793,542 B1* | 9/2004 | White ........................... 439/822 |
| 7,018,247 B1* | 3/2006 | Ranta et al. ................... 439/858 |
| 7,297,021 B1 | 11/2007 | Dixon |
| 7,347,722 B2 * | 3/2008 | Zhang et al. .................. 439/517 |
| 2007/0066131 A1 | 3/2007 | Montalbo et al. |

* cited by examiner

*Primary Examiner* — Neil Abrams (57) ABSTRACT

The present invention relates generally to a lever bypass plug-in meter socket. More particularly, the invention encompasses a lever bypass plug-in meter socket for electric watt-hour meters. The present invention is also directed to a novel plug-in meter socket for electrical watt-hour meter with a quick bypass. A lever may be used to rotate a bypass blade to short selected contacts through the blade when the watt-hour meter needs to be changed or tested.

20 Claims, 6 Drawing Sheets

LEVER BYPASS PLUG-IN METER SOCKET FOR ELECTRIC WATT-HOUR METERS

CROSS-REFERENCE TO RELATED APPLICATION

The instant patent application claims priority to and the benefit of pending U.S. Provisional Patent Application Ser. No. 61/227,903, filed on Jul. 23, 2009, titled "Lever Bypass Plug-in Meter Socket for Electric Watt-hour Meters," the entire disclosure of which provisional application is incorporated herein by reference.

FIELD OF THE INVENTION

The present invention relates generally to a lever bypass plug-in meter socket. More particularly, the invention encompasses a lever bypass plug-in meter socket for electric watt-hour meters. The present invention is also directed to a novel plug-in meter socket for electrical watt-hour meter with a quick bypass.

BACKGROUND INFORMATION

Socket type electrical watt-hour meters are used to measure and indicate the amount of electrical power consumption in a residence, industry or business. Typically, a socket type watt-hour meter plugs into a meter socket using a blade-like stab or meter blade connector located on the watt-hour meter. The meter socket itself is mounted inside a meter base or a panel. A meter socket commonly has a spring loaded receptacle-like jaw to receive and contact the watt-hour meter blade insertion. The meter jaw and spring provide enough force to press meter blade and conduct electricity while maintaining a certain current load and a heat rise. One disadvantage of the current meter socket is that the spring bias force may exceed the industry standard limit for the force required to insert and extract the watt-hour meter. Another disadvantage of the current meter socket is that the spring does not provide consistent pressure over time for a reliable connection between the meter jaw and watt-hour meter blade.

The meter socket for a plug-in type watt-hour meter commonly uses "U" shaped one-piece or two piece jaw with return wrap receiving contacts. A disadvantage of the one-piece jaw, is that its shape limits the thickness of material used and more importantly, the one-piece jaw provides a long electrical current path by not directly contacting the meter blade and the bus bar. Similarly, there is a large amount of heat generated at the point of conduction in both the one piece and two piece jaws where such heat rise may cause meter malfunction if not properly dissipated.

U.S. Pat. No. 7,297,021 (Dixon, et al.), the entire disclosure of which is incorporated herein by reference, discloses exemplary embodiments comprising a system, which can comprise a bypass hub for an electrical meter. The bypass hub can comprise an electrically conductive blade comprising a first socket engageable end and a second socket engageable end. The electrically conductive blade can define a through-hole. The electrically conductive blade can be coupled to a shaft via at least one blade retainer.

U.S. Pat. No. 7,347,722 (Zhang, et al.), the entire disclosure of which is incorporated herein by reference, discloses a meter socket assembly comprising a meter jaw assembly and an extended bus bar for contact with a meter blade of a watt hour meter. The meter jaw assembly further comprises a meter jaw and a jaw spring guide that are mounted together by a fastening device to the extended bus bar. The extended bus bar comprises a chamfered terminal end and cutout portion to easily accept the meter blade. The jaw spring guide overlies the meter jaw and applies a bias force inward to urge the contact face of the meter jaw toward the extended bus bar closing any insertion space and guaranteeing tight contact with the meter blade. A meter socket guide snaps on to the bus bar to maintain the alignment of meter jaw with watt-hour meter blade.

Another disadvantage of the known meter socket is the difficulty in aligning both the one piece and the two piece jaws in both the vertical and horizontal direction with the meter blade.

Therefore there is a need for improvement in meter socket assemblies and in particular meter jaw assemblies.

This invention improves on the deficiencies of the prior art and provides an inventive lever bypass plug-in meter socket for electric watt-hour meter.

PURPOSES AND SUMMARY OF THE INVENTION

The invention in one aspect is a novel lever bypass plug-in meter socket for electric watt-hour meter.

Therefore, one purpose of this invention is to provide a lever bypass plug-in meter socket for electric watt-hour meters.

Another purpose of this invention is to provide a reliable and quick solution for an electric watt-hour meter to operate in either an active or an inactive bypass mode.

Yet another purpose of this invention is to provide a hybrid meter socket which inherits the high performance and quality of a lever bypass clamping jaw meter socket for heavy duty industrial utilities, and the convenience of a quick bypass for metering maintenance.

Therefore, in one aspect this invention comprises a connector subassembly for a lever bypass plug-in meter socket for electric watt-hour meters, comprising:
(a) a first connector subassembly, comprising a first housing, said first housing having a first wall connected to a second wall, said second wall connected to a third wall, and said third wall connected to a fourth wall to form an enclosure, and wherein said first wall is separated from said fourth wall to form an opening for the passage of at least one bypass blade;
(b) at least one meter jaw terminal contact secured to said third wall via at least one securing means such that said meter jaw terminal is inside said enclosure, and wherein said meter jaw terminal is made from an electrically conductive material;
(c) at least one spring bracket secured to said third wall via at least one securing means such that said spring bracket is inside said enclosure, and wherein said spring bracket is made from an electrically conductive material;
(d) wherein at least a portion of said meter jaw terminal contact is sufficiently away from said third wall so as to form at least one opening for at least one meter blade; and
(e) wherein said spring bracket has an extended portion that extends from said third wall towards said first wall, and said extended portion is sufficiently away from said first wall so at to form at least one opening for the passage of said at least one bypass blade, wherein said at least one bypass blade is made from an electrically conductive material, and thereby forming said connector subassembly for a lever bypass plug-in meter socket for electric watt-hour meters.

In another aspect this invention comprises a lever bypass plug-in meter socket for electric watt-hour meter, comprising:

(a) a meter socket housing comprising at least one first connector subassembly, at least one second connector subassembly, and at least one rotary bypass blade assembly;

(b) said at least one first connector subassembly, comprising a first housing, said first housing having a first wall connected to a second wall, said second wall connected to a third wall, and said third wall connected to a fourth wall to form an enclosure, and wherein said first wall is separated from said fourth wall to form an opening for the passage of at least one first bypass blade;

(c) at least one meter jaw terminal contact secured to said third wall via at least one securing means such that said meter jaw terminal is inside said enclosure, and wherein said meter jaw terminal is made from an electrically conductive material;

(d) at least one spring bracket secured to said third wall via at least one securing means such that said spring bracket is inside said enclosure, and wherein said spring bracket is made from an electrically conductive material;

(e) wherein at least a portion of said meter jaw terminal contact is sufficiently away from said third wall so as to form at least one opening for at least one first meter blade;

(f) wherein said spring bracket has an extended portion that extends from said third wall towards said first wall, and said extended portion is sufficiently away from said first wall so at to form at least one first opening for the passage of said at least one first bypass blade;

(g) said at least one second connector subassembly, comprising a first housing, said first housing having a first wall connected to a second wall, said second wall connected to a third wall, and said third wall connected to a fourth wall to form an enclosure, and wherein said first wall is separated from said fourth wall to form an opening for the passage of at least one second bypass blade;

(h) at least one meter jaw terminal contact secured to said third wall via at least one securing means such that said meter jaw terminal is inside said enclosure, and wherein said meter jaw terminal is made from an electrically conductive material;

(i) at least one spring bracket secured to said third wall via at least one securing means such that said spring bracket is inside said enclosure, and wherein said spring bracket is made from an electrically conductive material;

(j) wherein at least a portion of said meter jaw terminal contact is sufficiently away from said third wall so as to form at least one opening for at least one second meter blade;

(k) wherein said spring bracket has an extended portion that extends from said third wall towards said first wall, and said extended portion is sufficiently away from said first wall so at to form at least one second opening for the passage of at least one second bypass blade;

(l) wherein said first connector subassembly is opposite said second connector subassembly such that said at least one first bypass blade opening directly faces said at least one second bypass blade opening;

(m) said rotary bypass blade assembly comprising a lever connected to a lever rod, said lever rod having at least one blade assembly, wherein said blade assembly comprises a blade housing having at least one first bypass blade and at least one second bypass blade, wherein said at least one first bypass blade is directly opposite said at least one second bypass blade, and wherein said at least one first bypass blade and said at least one second bypass blade protrude out of said blade housing in an outwardly direction, and wherein said at least one first bypass blade and said at least one second bypass blade is made from an electrically conductive material; and (n) wherein said at least one first bypass blade and said at least one second bypass blade are between said at least one first bypass blade opening and said at least one second bypass blade opening such that upon rotation of said lever said at least one first bypass blade is in electrical contact with said first housing, and said at least one second bypass blade is in electrical contact with said second housing, and thereby forms said lever bypass plug-in meter socket for electric watt-hour meter.

BRIEF DESCRIPTION OF THE DRAWINGS

Although the scope of the present invention is much broader than any particular embodiment, a detailed description of the preferred embodiment follows together with drawings. These drawings are for illustration purposes only and are not drawn to scale. Like numbers represent like features and components in the drawings. The invention may best be understood by reference to the ensuing detailed description in conjunction with the drawings in which.

DETAILED DESCRIPTION

This invention presents a plug-in style meter socket for electrical watt-hour meters with lever quick bypass. This inventive hybrid meter socket inherits the high performance and quality of lever bypass clamping jaw meter socket for heavy duty industrial utilities, and the convenient of quick bypass for metering maintenance. The meter socket also takes advantage of plug-in style meter sockets' easy insertion and extraction of electrical watt-hour meters. The meter jaws in the inventive meter socket uses an inventive lever bypass clamping jaw housing as stationary meter jaw base. A copper half-jaw reinforced by a spring bracket is fastened on to the clamping jaw housing. The combination of the clamping jaw housing and the copper half-jaw creates a receptacle opening for accepting meter blade. On the lower side of the jaw housing, the spring bracket is formed biasing outward so that it could engage rotary bypass and press the bypass blade contacting on the jaw housing inner surface to make electrical bypass circuit. As one can appreciate that the bypass circuit is shorting the same phase line and load contacts through the bypass blade when an installed electrical watt-hour meter needs to be changed or tested.

Another advantage of the inventive hybrid meter socket is that the meter socket is compatible with, and shares all accessory shields of existing heavy duty quick lever bypass meter socket to make all configurations of 4 to 14 meter jaws for accepting most variety of commercial electrical watt-hour meters.

Figure 1:
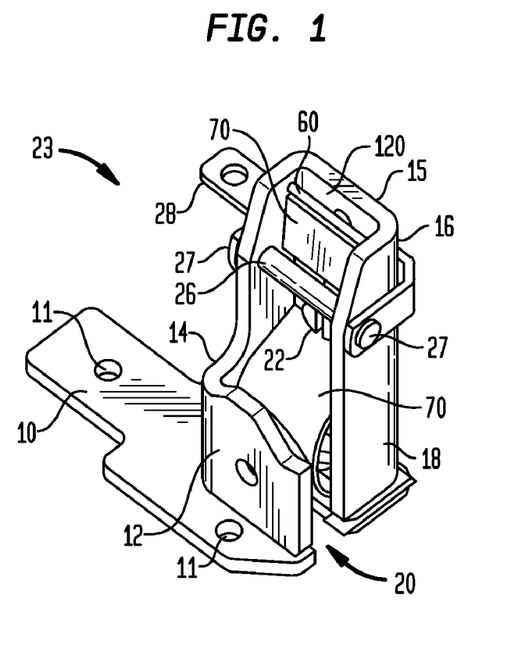
FIG. 1, illustrates a perspective view of a first or right side connector subassembly of the plug-in meter jaw of this invention.

FIG. 1, illustrates a perspective view of a first or a right side connector subassembly of the plug-in meter jaw 23, of this invention. The first or the top half of the plug-in meter jaw 23, comprises a base bracket 10, having at least one opening 11, for a securing means (not shown). The plug-in meter jaw 23, further comprises of a first or top housing 15, having a face wall 12, a side wall 14, a back wall 16, a blade wall 18, and a bypass blade opening 20. The housing 15, can also have a bracket 28, to secure the housing 15, to a plug-in style meter socket 100, shown in FIG. 10. The housing 15, can also have a rod or shaft 26, secured to the housing 15, via at least one securing means 27. As one can see that a meter jaw terminal or contact 60, along with a spring bracket 70, has been secured to the housing 15, via at least one securing means 22, and which creates a meter blade insertion opening 120.

Figure 2:
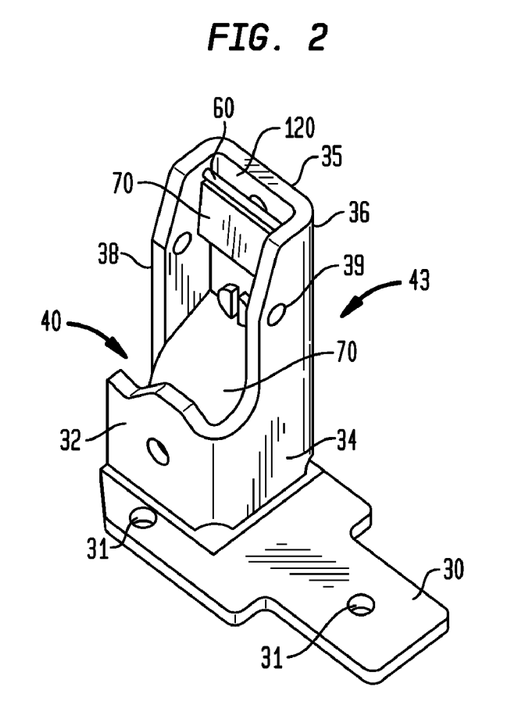
FIG. 2, illustrates a perspective view of a second or left side connector subassembly of the plug-in meter jaw of this invention.

FIG. 2, illustrates a perspective view of a second or a left side connector subassembly of the plug-in meter jaw 43, of this invention. The second or the bottom half of the plug-in meter jaw 43, comprises a base bracket 30, having at least one opening 31, for a securing means (not shown). The plug-in meter jaw 43, further comprises of a second or bottom housing 35, having a face wall 32, a side wall 34, a back wall 36, a blade wall 38, and a bypass blade opening 40. The housing 35, can also have a bracket similar to bracket 28, to secure the housing 35, to a plug-in style meter socket 100, shown in FIG. 10. The housing 15, can also have one or more opening 39, for securing the housing 35.

It should be understood that each final assembly has a total of 6 connectors for 3 phase or 4 connectors for single phase. This final assembly comprises of the first or a right side connector subassembly of the plug-in meter jaw 23, and the second or left side connector subassembly of the plug-in meter jaw 43, and both these subassemblies 23, 43, face each other so that that bypass blade opening 20, and the bypass blade opening 40, are facing each other, for the insertion or passage of bypass blades 82, 86, of a rotary bypass blade assembly 85, shown in FIG. 6.

Figure 3:
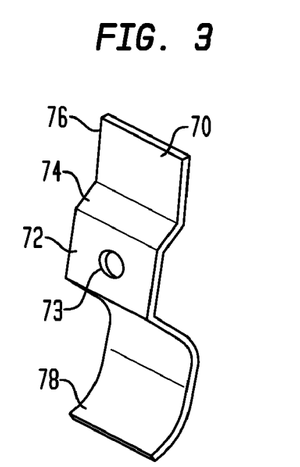
FIG. 3, illustrates a perspective view of a spring bracket of this invention.

FIG. 3, illustrates a perspective view of a spring bracket 70, of this invention. The spring bracket 70, comprises of a flat base or portion 72, having at least one opening 73, for a securing means 22. The spring bracket 70, further comprises of an angled or slope portion 74, which is secured to an upper spring bracket or spring tab support 76. As one can appreciate that the spring bracket 70, is mated with the meter jaw terminal or contact 60, such that the securing means 22, secures them via the opening 63, to the back wall 16, of the housing 15, or the opening 73, to the back wall 36, of the housing 35. The spring bracket 70, also has an extended or bottom or lower spring bracket 78.

Figure 4:
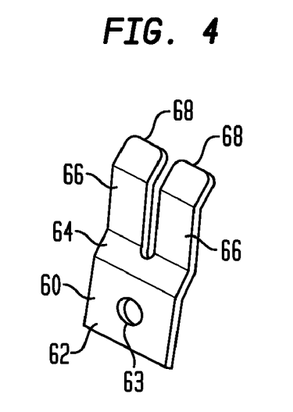
FIG. 4, illustrates a perspective view of a meter jaw terminal contact of this invention.

FIG. 4, illustrates a perspective view of a meter jaw terminal or contact 60, of this invention. The meter jaw terminal or contact 60, comprises of a jaw or bracket base 62, having at least one opening 63, for a securing means 22. The meter jaw terminal or contact 60, has an angled or slope portion 64, which is secured to a blade tab 66, having a termination tab 68. For the purposes of illustration two blade tabs 66, are shown, however, it should be understood that the meter jaw terminal or contact 60, could have one or more blade tab 66.

Figure 5:
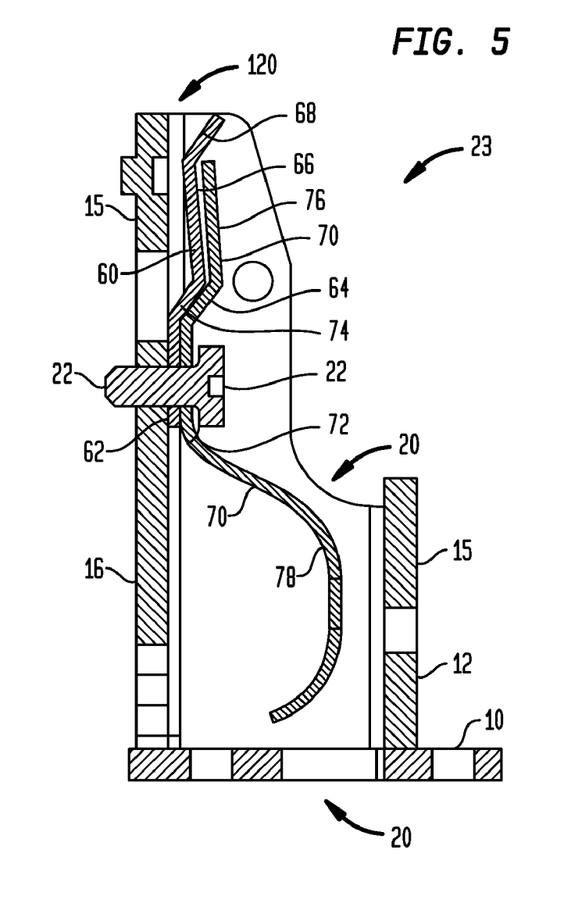
FIG. 5, illustrates a cut-away cross-sectional view of a meter jaw of this invention.

FIG. 5, illustrates a cut-away cross-sectional view of a meter jaw 23, 43. For the purposes of illustration housing 15, is being used, however, the cross-sectional area would be similar for the housing 35. One can see that the jaw housing 15, has meter jaw terminal or contact 60, secured to a spring bracket 70, using at least one fastener 22, and which creates a meter blade insertion opening 120, at the first or upper end, and a bypass blade opening 20, at the second or lower end. As one can see in FIG. 5, that once a meter blade (not shown) is inserted into the meter blade insertion opening 120, the meter blade is securely held in place between the back wall 16, and the blade tab 66. Similarly, when the bypass blade 86, is inserted into the bypass blade opening 20, the bypass blade 86, is securely held in place between the face wall 12, and the extended spring bracket 78.

Figure 6:
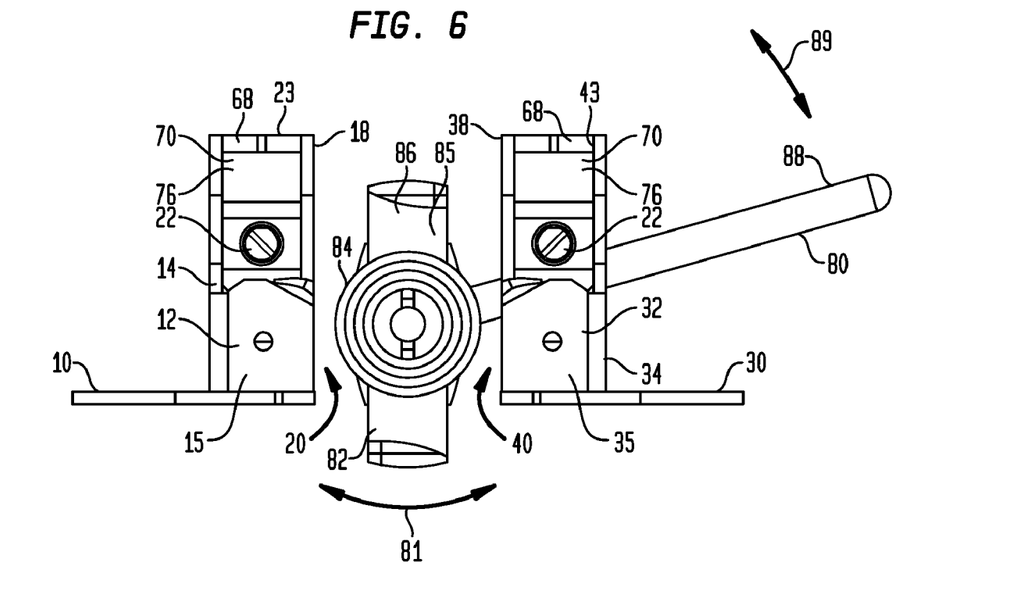
FIG. 6, illustrates a side view of a lever with a blade securely held between the line and load connectors of the plug-in meter jaw of this invention with the bypass in a non-active position.
Figure 10:
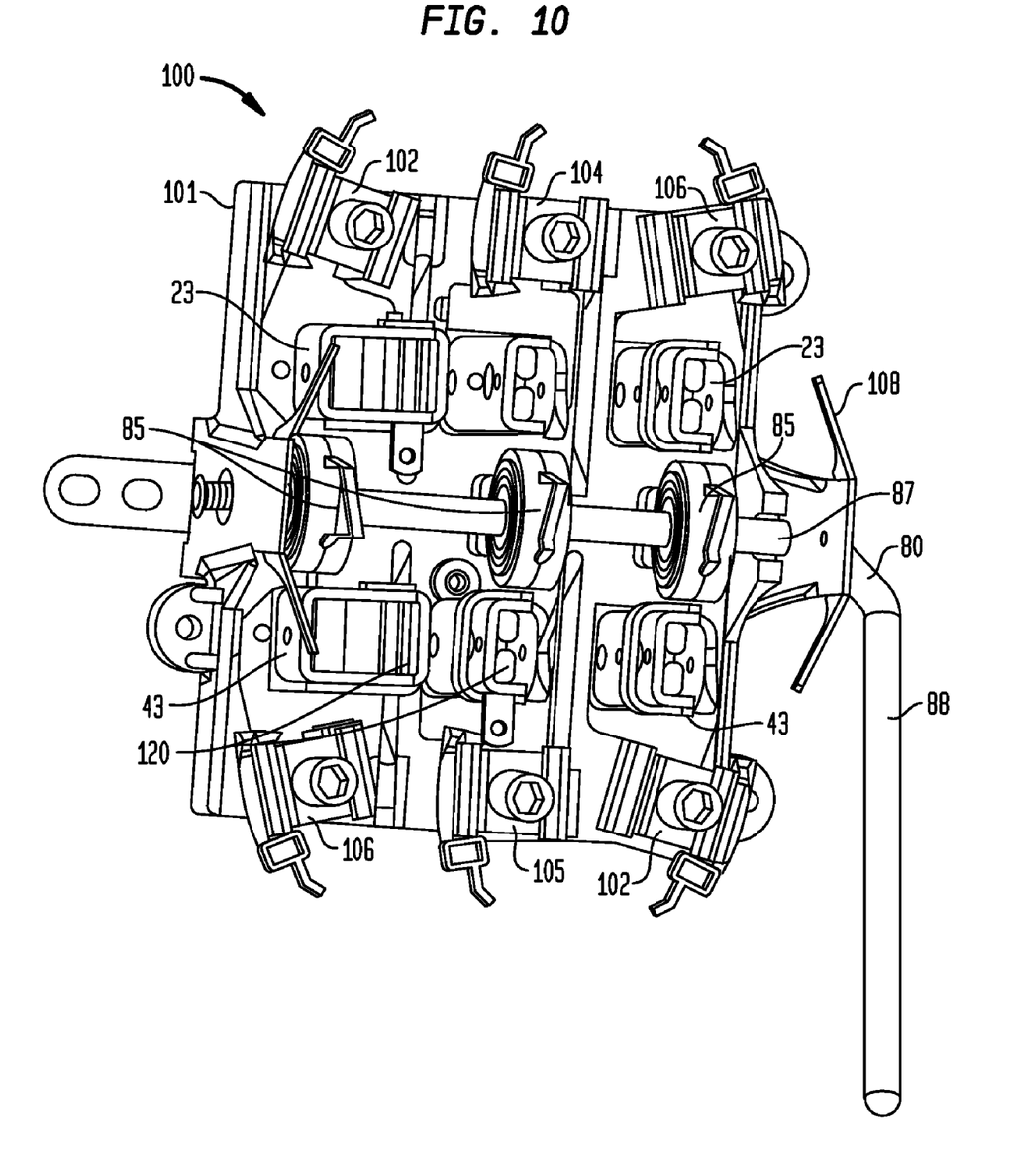
FIG. 10, illustrates a top view of the inventive plug-in type meter socket.

FIG. 6, illustrates a side view of a rotary levered bypass assembly 80, having a lever 88, with a first or top or upper bypass blade 82, and a second or bottom or lower bypass blade 86, which are securely held in a meter socket housing 101, of the plug-in style meter socket 100, shown in FIG. 10. The rotary levered bypass assembly 80, is positioned, such that the rotary bypass blade assembly 85, is between the line and load connectors 23, 43, of the plug-in meter jaw of this invention. As shown in FIG. 6, the bypass assembly 80, is in a non-active position. The rotary levered bypass assembly 80, has the lever 88, in a bypass mode, such that the bypass blades 82, 86, are not in electrical contact with the housing 15, 35. The lever 88, is connected to a lever rod or shaft or bypass assembly rod 87, shown in FIG. 8, and the lever rod 87, is secured to blade housing 84. The bypass blades 82, 86, are also secured to the blade housing 84. For most applications it is preferred that the top or first bypass blade 82, and the bottom or second bypass blade 86, are about 180 degree apart from each other, and at the opposite end of the blade housing 84. The blade housing 84, is made of an electrically non-conductive material, while the bypass blades 82, 86, are made from an electrically conductive material. Arrow 81, indicates the movement or rotation direction of the lever bypass blades 82, 86, while arrow 89, indicates the movement or rotation direction of the lever 88.

Figure 7:
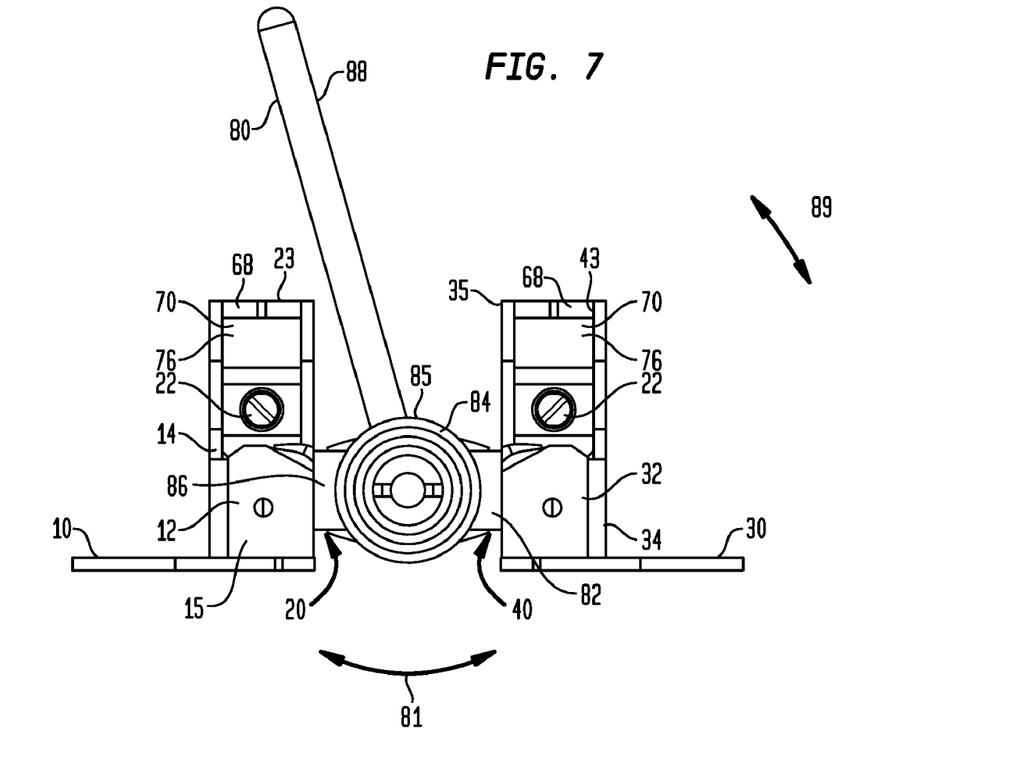
FIG. 7, illustrates a side view of a lever with a blade securely held between the line and load connectors of the plug-in meter jaw of this invention with the bypass in an active position.

FIG. 7, illustrates a side view of a rotary levered bypass assembly 80, having the lever 88, with a bypass blade 82, 86, securely held between the line and load connectors or the plug-in meter jaw 23, 43, of this invention with the bypass in an active position. The rotary levered bypass assembly 80, has the lever 88, in an active mode, such that the bypass blades 82, 86, are in direct electrical contact with the housing 35, 15 respectively.

Figure 8:
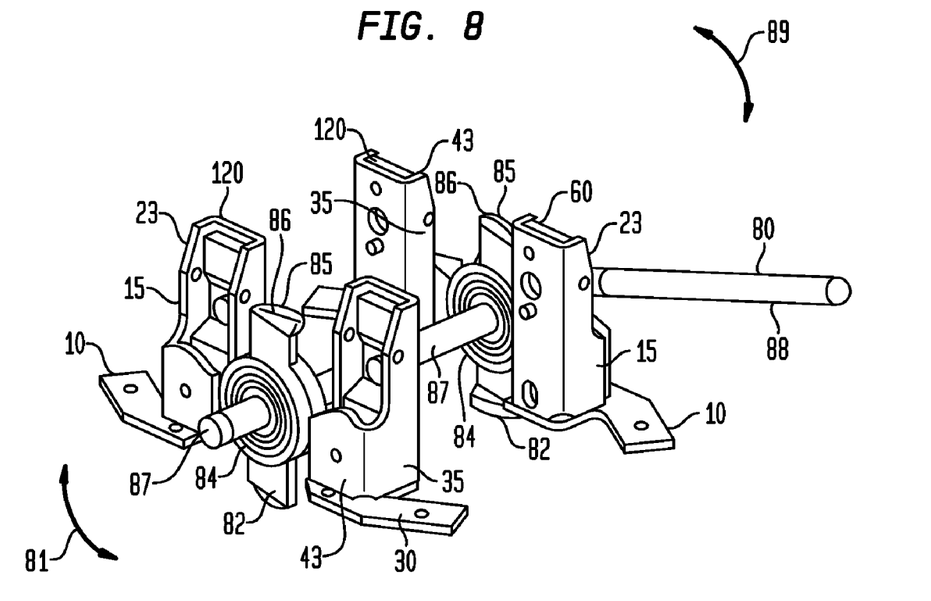
FIG. 8, illustrates an isometric view of a lever with a blade securely held between the line and load connectors of the plug-in meter jaw of this invention with the bypass in a non-active position.

FIG. 8, illustrates an isometric view of a rotary levered bypass assembly 80, a lever 88, with a bypass blade 82, 86, securely held between the line and load connectors or the plug-in meter jaw 23, 43, of this invention with the bypass assembly 80, in a non-active position. The lever 88, and the lever rod or bypass assembly rod 87, could be made as a one piece item or could be made separately and then secured to each other by means well know in the art, for example, welding. FIG. 8, also illustrates an embodiment of this invention showing the rotary bypass blade assembly 80, having two blade assembly 85, on the bypass assembly rod 87.

Figure 9:
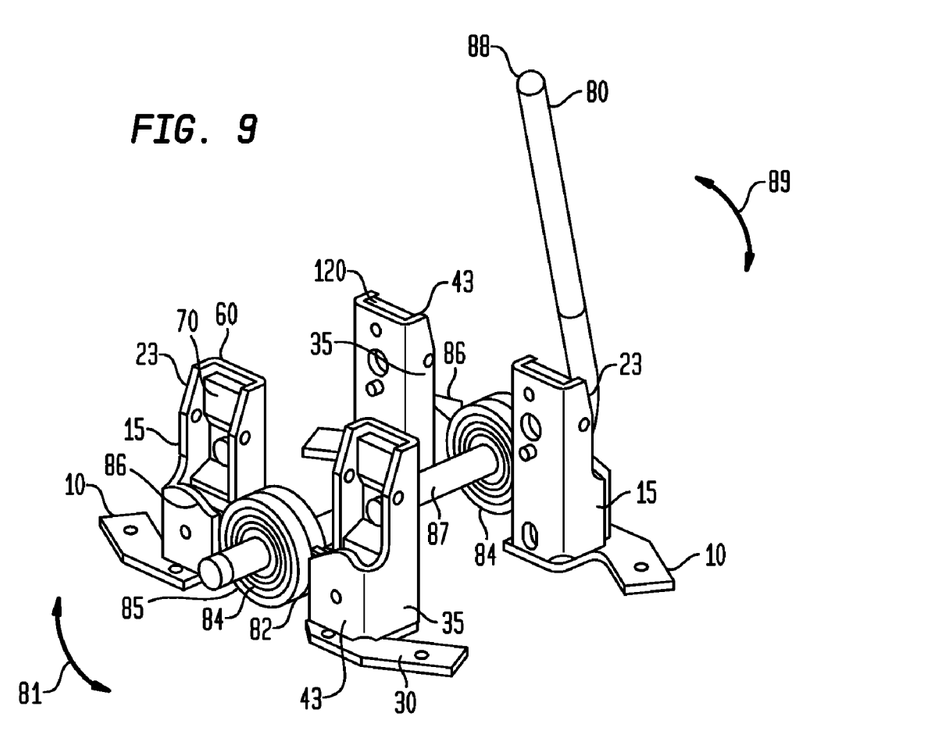
FIG. 9, illustrates an isometric view of a lever with a blade securely held between the line and load connectors of the plug-in meter jaw of this invention with the bypass in an active position.

FIG. 9, illustrates an isometric view of a rotary levered bypass assembly 80, a lever 88, with a bypass blade 82, 86, securely held between the line and load connectors or the plug-in meter jaw 23, 43, of this invention with the bypass assembly 80, in an active position.

FIG. 10, illustrates a top view of an inventive plug-in type meter socket 100, with the line and load connectors or the plug-in meter jaws 23, 43, lever bypass assembly 80, and meter socket housing 101. As one can see that the meter socket housing 101, has a rotary bypass blade assembly 80, having three rotary bypass blade assembly 85, connected to a single lever rod or shaft 87, and to a single lever 88. In the bypass active mode each of the rotary bypass blade assembly 85, has bypass blades 82, 86, that rotate and get inserted into housing 23, 43, via bypass blade openings 20, 40, respectively. Similarly, in the bypass inactive mode, upon open rotation of the lever 88, each of the bypass blades 82, 86, rotate out of the housing 23, 43, via the bypass blade openings 20, 40, respectively. The housing 101, has a bridge 108, a first or left connector assembly 102, a second or right connector assembly 106, and two middle connector assemblies 104, 105, where the two middle connector assemblies have opposite polarity.

Figure 11:
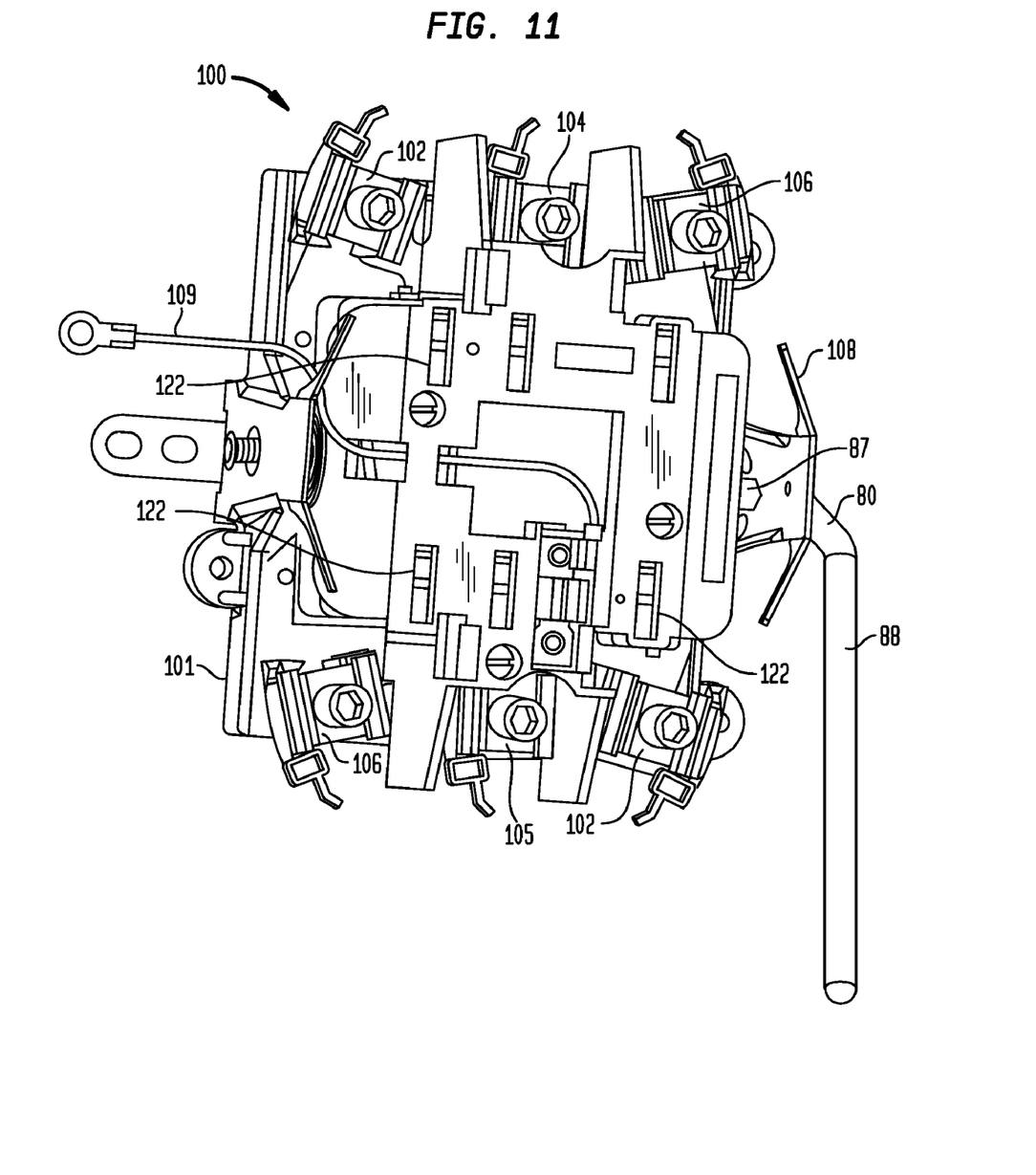
FIG. 11, illustrates a top view of the inventive plug-in style meter socket with the rotary blade assembly.

FIG. 11, illustrates a top view of the inventive plug-in style meter socket 100, with the rotary blade assembly 80, of this invention. The plug-in style meter socket 100, has the meter socket housing 101, with a cover 110, and a fifth terminal wire or ground wire 109. The cover 110, also has at least one meter blade insertion opening 122.

As one can see that the meter socket assembly 100, comprising a meter jaw assembly 23, 43, with an extended spring bracket 70. The meter jaw assembly 23, 43, further provides a plug-in capability for meter blades (not shown) and also provides meter bypass capability utilizing the rotary bypass blade assembly 80.

The meter jaw assembly 23, 43, further comprises of a housing 15, 35, a meter jaw terminal or contact 60, and an extended spring bracket 70. The meter jaw terminal 60, and the spring 70, are fastened to the housing 15, 35, via at least one securing means 22.

The top of the spring bracket 70, backs up the meter jaw terminal 60, and applies more clamping force when a meter blade (not shown) is inserted; the extended (bottom) portion 78, of the spring bracket 70, supplies force to the other direction by pushing bypass blades 82, 86, against the wall 36, 16, of the housing 35, 15, to ensure electrical contact when the bypass blades 82, 86, are engaged.

The inventive meter socket 100, that utilizes the jaw assembly 23, 43, further comprises sets of jaw assemblies 23, 43, a base 10, 30, a levered bypass assembly 80, and other components inherent to the function of the meter socket 100. It should be appreciated that each final assembly has a total of 6 connectors for 3 phase or 4 connectors for single phase.

The inventive meter socket 100, offers a desired combination of features: a plug-in meter socket 100, having a lever bypass assembly 80. The construction of the inventive meter socket 100, takes advantage of high performance of the commercial lever bypass meter socket solid busing and includes the convenience of plug-in meter socket jaw mechanism.

To engage the bypass, the lever 88, is pushed or rotated in a direction so that the bypass blade 82, 86, turns with the lever 88, and insert both sides of the bypass blades 82, 86, between the bypass blade openings 40, 20, of the jaw housing 35, 15, and comes in contact with the spring bracket 70, to make electrical contact, therefore bypassing electrical watt hour meter (not shown).

The bypass blades 82, 86, are made of an electrically conductive material, such as, for example, copper, aluminum, stainless steel, iron, to name a few.

The meter jaw terminal or contact 60, is made of an electrically conductive material, such as, for example, copper, aluminum, stainless steel, iron, to name a few.

The spring bracket 70, are made of an electrically conductive material, such as, for example, copper, aluminum, stainless steel, iron, to name a few.

While the present invention has been particularly described in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A connector subassembly for a lever bypass plug-in meter socket for electric watt-hour meters, comprising:
   (a) a first connector subassembly, comprising a first housing, said first housing having a first wall connected to a second wall, said second wall connected to a third wall, and said third wall connected to a fourth wall to form an enclosure, and wherein said first wall is separated from said fourth wall to form an opening for the passage of at least one bypass blade;
   (b) at least one meter jaw terminal contact secured to said third wall via at least one securing means such that said meter jaw terminal is inside said enclosure, and wherein said meter jaw terminal is made from an electrically conductive material;
   (c) at least one spring bracket secured to said third wall via at least one securing means such that said spring bracket is inside said enclosure, and wherein said spring bracket is made from an electrically conductive material;
   (d) wherein at least a portion of said meter jaw terminal contact is sufficiently away from said third wall so as to form at least one opening for at least one meter blade; and
   (e) wherein said spring bracket has an extended portion that extends from said third wall towards said first wall, and said extended portion is sufficiently away from said first wall so at to form at least one opening for the passage of said at least one bypass blade, wherein said at least one bypass blade is made from an electrically conductive material, and thereby forming said connector subassembly for a lever bypass plug-in meter socket for electric watt-hour meters.

2. The connector subassembly of claim 1, wherein said meter jaw terminal contact has a bracket base having at least one opening for the passage of at least one securing means, said bracket base is connected to at least one blade tab via a sloped bracket portion, and wherein said blade tab has a termination tab.

3. The connector subassembly of claim 1, wherein said meter jaw terminal contact has a bracket base having at least one opening for the passage of at least one securing means, said bracket base is connected to at least one blade tab via a sloped bracket portion, and wherein said blade tab has a termination tab, wherein said blade tab is supported by a spring tab, and wherein at least a portion of said termination tab is above said spring tab.

4. The connector subassembly of claim 1, wherein said spring bracket has a base portion having at least one opening for at least one securing means, said base portion is connected on a first side to a tab support via a sloped bracket portion, and on a second side to an extended spring bracket, and wherein said first side is opposite said second side.

5. The connector subassembly of claim 1, wherein said spring bracket has a base portion having at least one opening for at least one securing means, said base portion is connected on a first side to a spring tab via a sloped bracket portion, and on a second side to an extended spring bracket, and wherein said first side is opposite said second side, and wherein said spring tab is adjacent to and supports a blade tab of said meter jaw terminal contact.

6. The connector subassembly of claim 1, wherein material for said meter jaw terminal contact is selected from a group consisting of copper, aluminum, stainless steel, and iron.

7. The connector subassembly of claim 1, wherein material for said spring bracket is selected from a group consisting of copper, aluminum, stainless steel, and iron.

8. The connector subassembly of claim 1, wherein material for said at least one bypass blade is selected from a group consisting of copper, aluminum, stainless steel, and iron.

9. The connector subassembly of claim 1, wherein at least one securing means secures said connector subassembly to a meter socket housing.

10. A lever bypass plug-in meter socket for electric watt-hour meter, comprising:
   (a) a meter socket housing comprising at least one first connector subassembly, at least one second connector subassembly, and at least one rotary bypass blade assembly;
   (b) said at least one first connector subassembly, comprising a first housing, said first housing having a first wall connected to a second wall, said second wall connected to a third wall, and said third wall connected to a fourth wall to form an enclosure, and wherein said first wall is separated from said fourth wall to form an opening for the passage of at least one first bypass blade;
   (c) at least one meter jaw terminal contact secured to said third wall via at least one securing means such that said meter jaw terminal is inside said enclosure, and wherein said meter jaw terminal is made from an electrically conductive material;
   (d) at least one spring bracket secured to said third wall via at least one securing means such that said spring bracket is inside said enclosure, and wherein said spring bracket is made from an electrically conductive material;
   (e) wherein at least a portion of said meter jaw terminal contact is sufficiently away from said third wall so as to form at least one opening for at least one first meter blade;
   (f) wherein said spring bracket has an extended portion that extends from said third wall towards said first wall, and said extended portion is sufficiently away from said first wall so at to form at least one first opening for the passage of said at least one first bypass blade;
   (g) said at least one second connector subassembly, comprising a first housing, said first housing having a first wall connected to a second wall, said second wall connected to a third wall, and said third wall connected to a fourth wall to form an enclosure, and wherein said first wall is separated from said fourth wall to form an opening for the passage of at least one second bypass blade;
   (h) at least one meter jaw terminal contact secured to said third wall via at least one securing means such that said meter jaw terminal is inside said enclosure, and wherein said meter jaw terminal is made from an electrically conductive material;
   at least one spring bracket secured to said third wall via at least one securing means such that said spring bracket is inside said enclosure, and wherein said spring bracket is made from an electrically conductive material;
   (j) wherein at least a portion of said meter jaw terminal contact is sufficiently away from said third wall so as to form at least one opening for at least one second meter blade;
   (k) wherein said spring bracket has an extended portion that extends from said third wall towards said first wall, and said extended portion is sufficiently away from said first wall so at to form at least one second opening for the passage of at least one second bypass blade;
   (l) wherein said first connector subassembly is opposite said second connector subassembly such that said at least one first bypass blade opening directly faces said at least one second bypass blade opening;
   (m) said rotary bypass blade assembly comprising a lever connected to a lever rod, said lever rod having at least one blade assembly, wherein said blade assembly comprises a blade housing having at least one first bypass blade and at least one second bypass blade, wherein said at least one first bypass blade is directly opposite said at least one second bypass blade, and wherein said at least one first bypass blade and said at least one second bypass blade protrude out of said blade housing in an outwardly direction, and wherein said at least one first bypass blade and said at least one second bypass blade is made from an electrically conductive material; and
   (n) wherein said at least one first bypass blade and said at least one second bypass blade are between said at least one first bypass blade opening and said at least one second bypass blade opening such that upon rotation of said lever said at least one first bypass blade is in electrical contact with said first housing, and said at least one second bypass blade is in electrical contact with said second housing, and thereby forms said lever bypass plug-in meter socket for electric watt-hour meter.

11. The lever bypass plug-in meter socket for electric watt-hour meter of claim 10, wherein said meter jaw terminal contact has a bracket base having at least one opening for the passage of at least one securing means, said bracket base is connected to at least one blade tab via a sloped bracket portion, and wherein said blade tab has a termination tab.

12. The lever bypass plug-in meter socket for electric watt-hour meter of claim 10, wherein said meter jaw terminal contact has a bracket base having at least one opening for the passage of at least one securing means, said bracket base is connected to at least one blade tab via a sloped bracket portion, and wherein said blade tab has a termination tab, and wherein said blade tab is supported by a spring tab, while at least a portion of said termination tab is above said spring tab.

13. The lever bypass plug-in meter socket for electric watt-hour meter of claim 10, wherein said spring bracket has a base portion having at least one opening for at least one securing means, said base portion is connected on a first side to a tab support via a sloped bracket portion, and on a second side to an extended spring bracket, and wherein said first side is opposite said second side.

14. The lever bypass plug-in meter socket for electric watt-hour meter of claim 10, wherein said spring bracket has a base portion having at least one opening for at least one securing means, said base portion is connected on a first side to a spring tab via a sloped bracket portion, and on a second side to an extended spring bracket, and wherein said first side is opposite said second side, and wherein said spring tab is adjacent to and supports a blade tab of said meter jaw terminal contact.

15. The lever bypass plug-in meter socket for electric watthour meter of claim 10, wherein material for said meter jaw terminal contact is selected from a group consisting of copper, aluminum, stainless steel, and iron.

16. The lever bypass plug-in meter socket for electric watthour meter of claim 10, wherein material for said spring bracket is selected from a group consisting of copper, aluminum, stainless steel, and iron.

17. The lever bypass plug-in meter socket for electric watthour meter of claim 10, wherein material for said at least one first bypass blade is selected from a group consisting of copper, aluminum, stainless steel, and iron.

18. The lever bypass plug-in meter socket for electric watthour meter of claim 10, wherein material for said at least one second bypass blade is selected from a group consisting of copper, aluminum, stainless steel, and iron.

19. The lever bypass plug-in meter socket for electric watthour meter of claim 10, wherein at least one securing means secures said at least one first connector subassembly to said meter socket housing.

20. The lever bypass plug-in meter socket for electric watthour meter of claim 10, wherein at least one securing means secures said at least one second connector subassembly to said meter socket housing.

* * * * *